United States Patent
Gueissaz et al.

(10) Patent No.: US 11,378,921 B2
(45) Date of Patent: Jul. 5, 2022

(54) THERMOELECTRIC WATCH TESTABLE IN PRODUCTION OR AFTER-SALES SERVICE

(71) Applicant: The Swatch Group Research and Development Ltd, Marin (CH)

(72) Inventors: Francois Gueissaz, Cormondreche (CH); Alain Jornod, Neuchatel (CH); Yves Theoduloz, Yverdon-les-Bains (CH)

(73) Assignee: The Swatch Group Research and Development Ltd, Marin (CH)

( * ) Notice: Subject to any disclaimer, the term of this patent is extended or adjusted under 35 U.S.C. 154(b) by 28 days.

(21) Appl. No.: 16/437,200

(22) Filed: Jun. 11, 2019

(65) Prior Publication Data
US 2020/0004209 A1    Jan. 2, 2020

(30) Foreign Application Priority Data

Jul. 2, 2018 (EP) .................................. 18181271

(51) Int. Cl.
*G04G 19/06* (2006.01)
*G04C 10/00* (2006.01)
*H01L 35/02* (2006.01)
*H02J 7/34* (2006.01)

(52) U.S. Cl.
CPC ............. *G04G 19/06* (2013.01); *G04C 10/00* (2013.01); *H01L 35/02* (2013.01); *H02J 7/345* (2013.01)

(58) Field of Classification Search
CPC ........ G04G 19/06; G04C 10/00; H01L 35/02; H02J 7/345
See application file for complete search history.

(56) References Cited

U.S. PATENT DOCUMENTS

| 4,435,132 A * | 3/1984 | Haesloop ................ B63C 7/006 |
| | | 222/381 |
| 6,327,127 B1 | 12/2001 | Utsunomiya et al. |
| 2006/0274605 A1* | 12/2006 | Gauthey ................ G01S 19/28 |
| | | 368/47 |

(Continued)

FOREIGN PATENT DOCUMENTS

| CH | 617818 A * | 6/1980 | ............... G10K 9/12 |
| EP | 0 933 863 A2 | 8/1999 | |

(Continued)

OTHER PUBLICATIONS

Eng Abstract (Machine Translation) CH 617818A, accessed Mar. 17, 2021 (Year: 1980).*

(Continued)

*Primary Examiner* — Shannon M Gardner
(74) *Attorney, Agent, or Firm* — Oblon, McClelland, Maier & Neustadt, L.L.P.

(57) ABSTRACT

A thermoelectric watch including a thermoelectric generator; a voltage booster connected to the thermoelectric generator; an energy management circuit connected to the voltage booster and configured to control the charging of at least one energy storage element, the energy management circuit including an output configured to change from a first logic state to a second logic state when the thermoelectric generator starts generating electrical energy, and to change from the second logic state to the first logic state when the thermoelectric generator finishes generating electrical energy.

12 Claims, 8 Drawing Sheets

(56) References Cited

U.S. PATENT DOCUMENTS

2018/0173169 A1 6/2018 Gueissaz et al.

FOREIGN PATENT DOCUMENTS

| EP | 0 935 178 A2 | 8/1999 | |
|---|---|---|---|
| EP | 3 339 981 A1 | 6/2018 | |
| WO | WO-2007142934 A2 * | 12/2007 | ............. H01L 35/32 |

OTHER PUBLICATIONS

European Search Report dated Jan. 22, 2019 in European Application 18181271.0 filed on Jul. 2, 2018 (with English Translation of Categories of Cited Documents).

* cited by examiner

THERMOELECTRIC WATCH TESTABLE IN PRODUCTION OR AFTER-SALES SERVICE

CROSS-REFERENCE TO RELATED APPLICATION

This application claims priority to European Patent Application No. 18181271.0 filed on Jul. 2, 2018, the entire disclosure of which is hereby incorporated herein by reference.

FIELD OF THE INVENTION

The invention relates to a thermoelectric watch including a thermoelectric generator, a voltage booster connected to said thermoelectric generator and an energy management circuit connected to said voltage booster and configured to control the charging of at least one energy storage element.

BACKGROUND OF THE INVENTION

In the field of thermoelectric watches, those skilled in the art know that a thermoelectric generator can be used to provide electrical energy to a watch from body heat when the watch is on the wrist. As the thermoelectric generator produces a low voltage, a voltage booster can increase the voltage produced so as to obtain a sufficiently high voltage to power an energy management circuit. The energy management circuit makes it possible to charge at least one storage element such as a battery in order to power a motor of the thermoelectric watch even when the conditions for thermoelectric energy generation are no longer satisfied.

One drawback is that in production or after-sales service, an operator cannot know whether thermoelectric generation is active or inactive.

SUMMARY OF THE INVENTION

It is an object of the present invention to overcome the aforementioned drawback.

To this end, according to a first aspect, the invention relates to a thermoelectric watch.

Thus, as will be seen in detail hereinafter, when the energy management output changes from one state to another (via a rising or falling transition), it is possible, through various types of couplings (optical, acoustic, capacitive, inductive, radio frequency) between the load and a test apparatus, to know when thermoelectric generation is activated or deactivated.

According to a second aspect, the invention relates to a thermoelectric watch.

Thus, as will be seen in detail hereinafter, when the energy management output changes from one state to another (via a rising or falling transition), it is possible, by detecting the electric potential of the conductive element using a test apparatus, to know when the capacitor is charging and thus when thermoelectric generation is activated or deactivated.

BRIEF DESCRIPTION OF THE DRAWINGS

The invention will be described in more detail below with reference to the annexed drawings, given by way of non-limiting example, in which.

DETAILED DESCRIPTION OF THE INVENTION

Elements that are identical in structure or function appearing in the various Figures maintain the same references, unless otherwise specified.

Figure 5A:
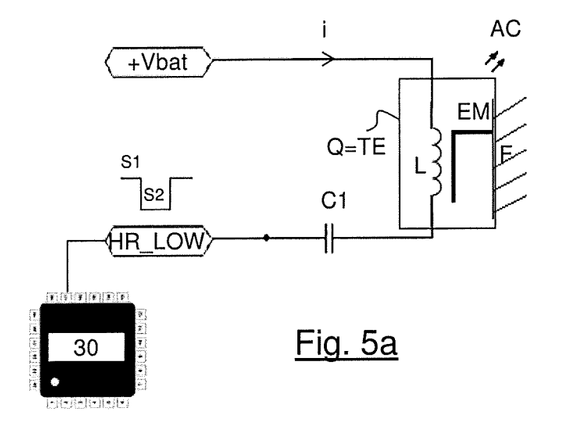
FIG. 5a represents the energy management circuit and the capacitor of FIG. 2a, said capacitor being coupled to a load which is an electromechanical transducer, according to a third non-limiting variant of the first embodiment.
Figure 5B:
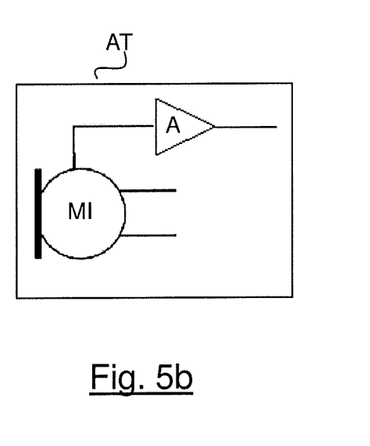
FIG. 5b represents a measuring apparatus configured to measure an acoustic signal emitted by said electromechanical transducer of FIG. 5a, FIG. 5c represents the energy management circuit and the two capacitors of FIG. 2b, said capacitors each being coupled to a load which is an electromechanical transducer, according to a third non-limiting variant of the second embodiment.
Figure 5C:
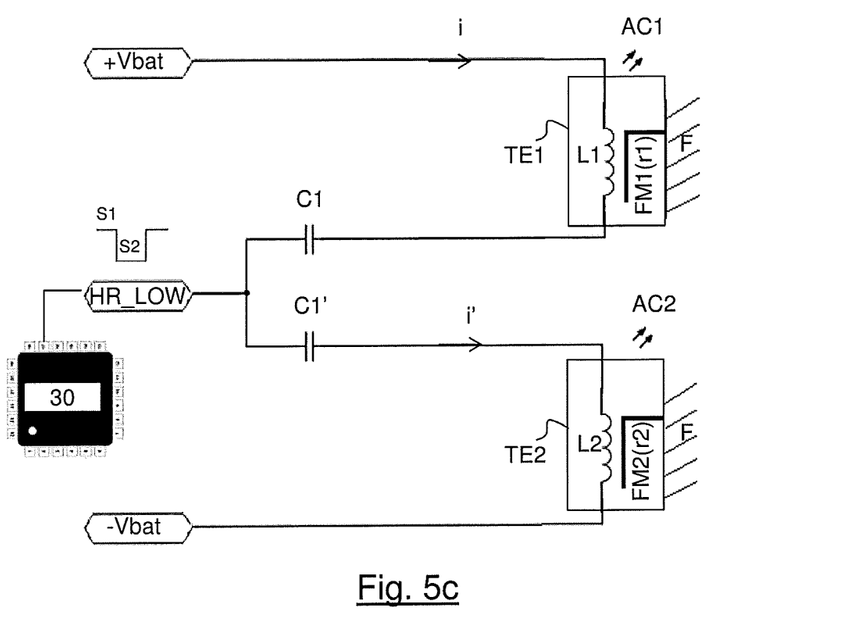
Figure 6A:
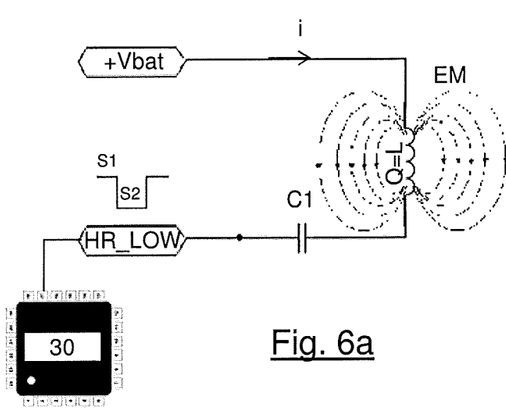
FIG. 6a represents the energy management circuit and the capacitor of FIG. 2a, said capacitor being coupled to a load which is an inductor, according to a fourth non-limiting variant of the first embodiment.
Figure 6B:
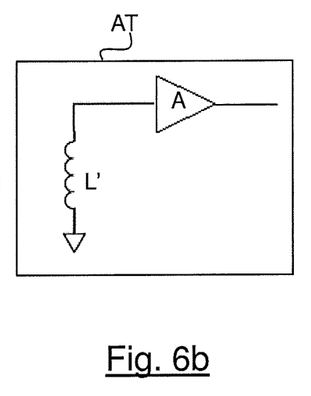
FIG. 6b represents a measuring apparatus configured to measure an electromagnetic signal emitted by said inductor of FIG. 6a, FIG. 7 schematically represents a thermoelectric watch according to a second embodiment of the invention, said thermoelectric watch including a voltage generator, a voltage booster and an energy management circuit according to a third non-limiting embodiment of the invention.
Figure 7:
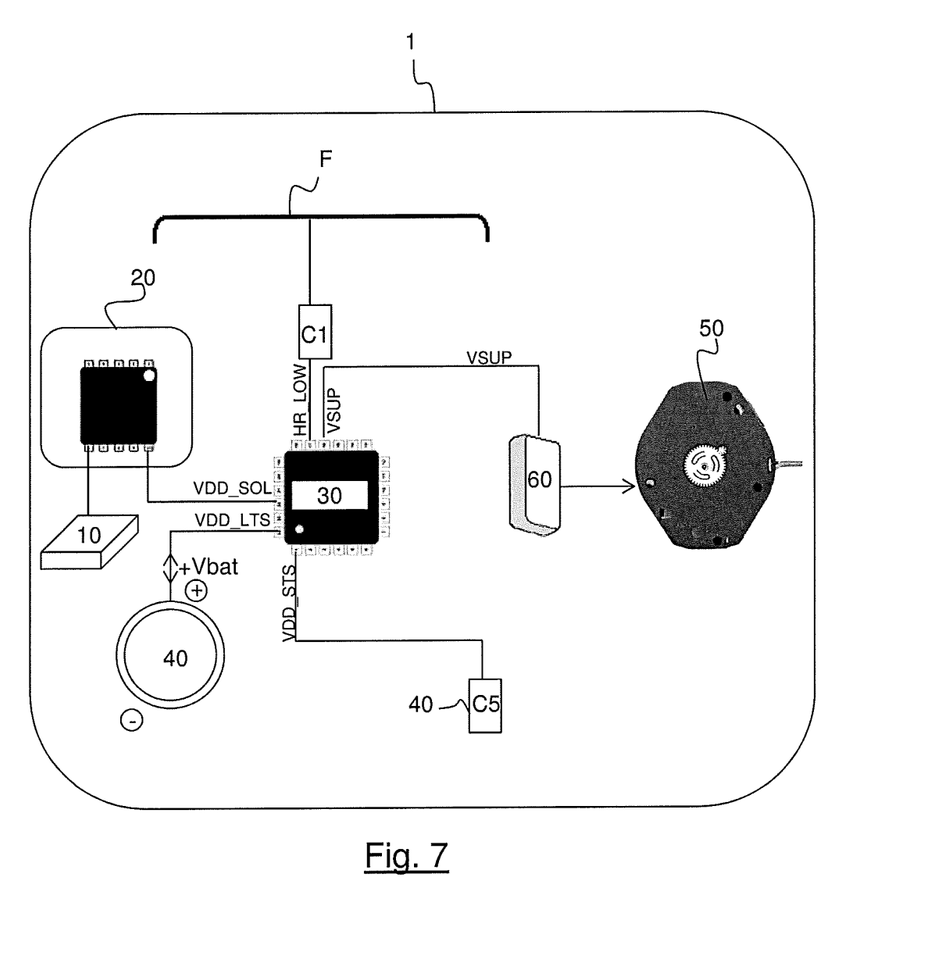
Figure 8:
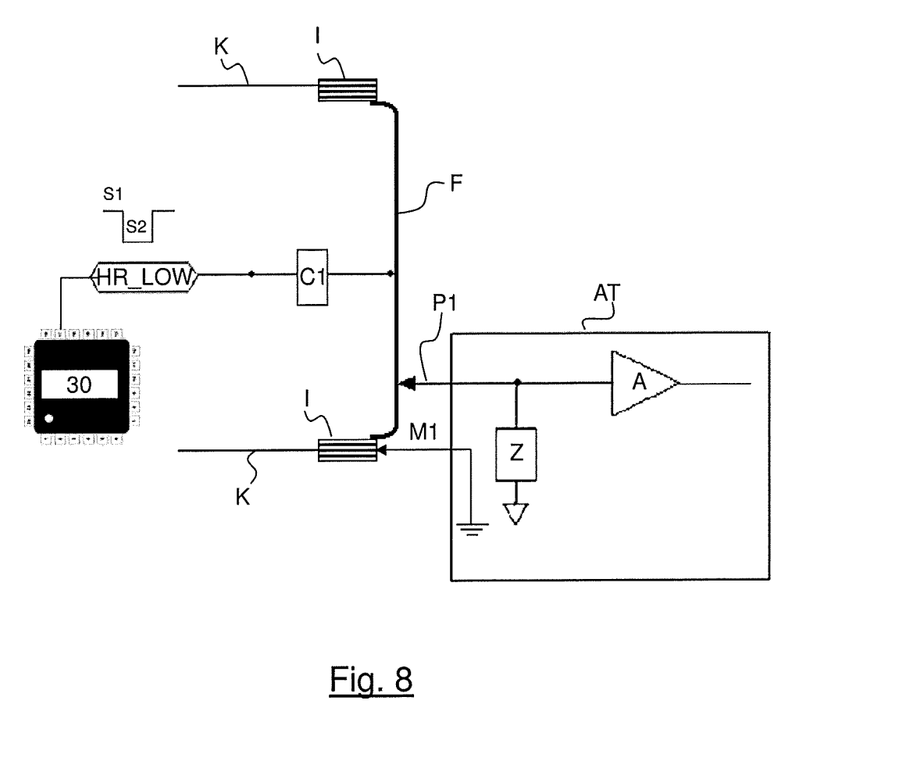
FIG. 8 represents the energy management circuit of FIG. 7 connected to the capacitor, which is itself connected to a conductive element.

The thermoelectric watch 1 is described according to first and second non-limiting embodiments illustrated in FIGS. 1 to 6b, and then a third non-limiting embodiment illustrated in FIGS. 7 and 8.

First and Second Non-Limiting Embodiments

Figure 1:
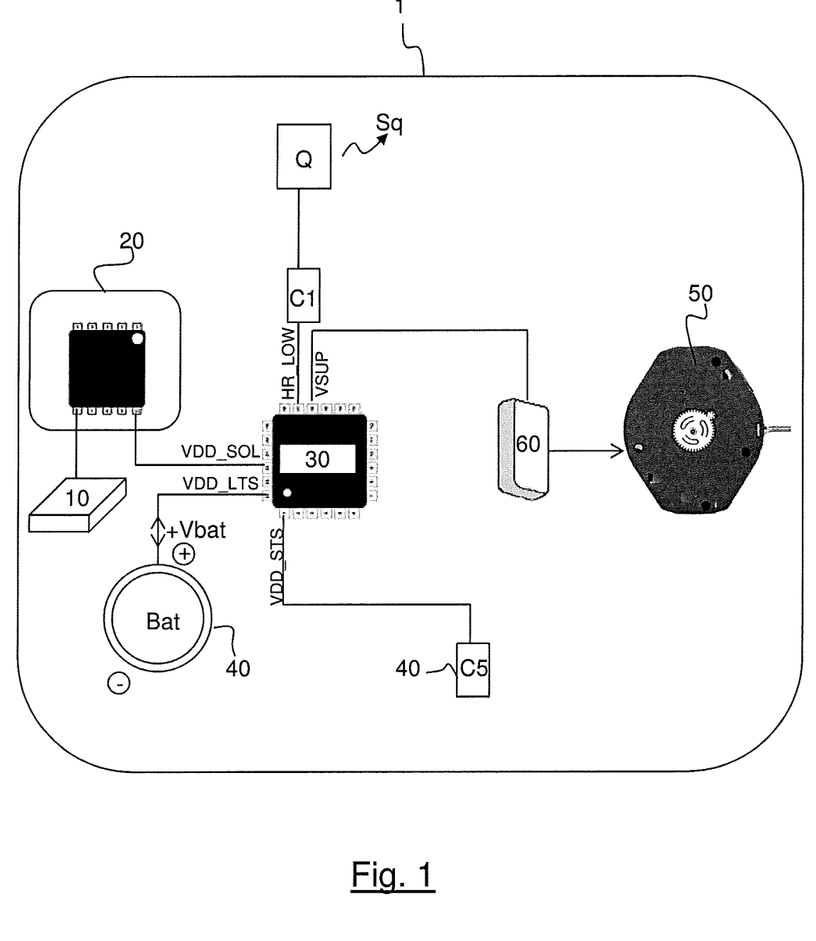
FIG. 1 schematically represents a thermoelectric watch according to a first non-limiting embodiment of the invention, said thermoelectric watch including a voltage generator, a voltage booster and an energy management circuit.

As illustrated in FIG. 1, thermoelectric watch 1 includes:
a thermoelectric generator 10;
a voltage booster 20;
an energy management circuit 30;
at least one capacitor C1.
Thermoelectric watch 1 also includes:
an energy storage element 40;
a motor 50 configured to move the hands and dial(s) (not illustrated) of thermoelectric watch 1;
a resonator 60 configured to act as frequency base for thermoelectric watch 1.

In the following description, thermoelectric watch 1 is also referred to as watch 1. The elements of watch 1 are described in detail hereinafter.

Thermoelectric Generator 10

Thermoelectric generator 10 is configured to produce electrical energy, namely a low voltage, on the order of a few millivolts (mV) from human body heat when watch 1 is on a user's wrist. In a non-limiting example, the voltage is comprised between 6 and 12 mV. It will be noted that generation of electrical energy normally takes less than one second when watch 1 is placed on the wrist.

Thus, thermoelectric generator 10 becomes active when the watch is worn on the wrist. Thermoelectric generator 10 allows watch 1 to start when the battery of said watch is discharged.

Since thermoelectric generators are known to those skilled in the art, thermoelectric generator 10 is not described in detail here.

Thermoelectric generator 10 is connected to voltage booster 20.

Voltage Booster 20

Voltage booster 20 is configured to boost the voltage generated by thermoelectric generator 10 to obtain a sufficiently high voltage to power energy management circuit 30. This voltage is on the order of a volt. In a non-limiting example, it is equal to 2.5V.

Voltage booster 20 is connected to energy management circuit 30.

The generated voltage is across an input VDD_SOL of said energy management circuit 30. Thus, a voltage higher than or equal to a threshold (2.5 V in the non-limiting example described) means that thermoelectric generator 10 is active, in other words that it has started generating electrical energy.

Since voltage boosters are known to those skilled in the art, voltage booster 20 is not described in detail here.

Energy Control Circuit 30 and Energy Storage Element 40

Energy control circuit 30 is configured to control the charging of at least one energy storage element 40.

In a non-limiting embodiment, energy management circuit 30 is a programmable microcontroller configured to charge said at least one energy storage element 40.

In a non-limiting embodiment management circuit 30 includes a push-pull amplifier circuit in order to obtain rising and falling transitions across output HR_LOW described below, with a certain capacity to deliver current, typically 1 to 2 mA in a non-limiting embodiment.

As illustrated in FIG. 1, energy management circuit 30 includes, in particular:

an input VDD_SOL,
an output HR_LOW,
an output VSUP,
an output VDD_LTS,
an output VDD_STS.

Through the voltage received at its input VDD_SOL, energy management circuit 30 can power said at least one energy storage element 40.

In a non-limiting example, said at least one energy storage element 40 is a battery Bat. Battery Bat makes it possible to power, for example, motor 50 of watch 1, even when there is no longer any electrical energy generation.

In a non-limiting embodiment, energy management circuit 30 is configured to control the charging of two energy storage elements 40. Each energy storage element 40 is connected to energy management circuit 30 via the respective outputs VDD_LTS and VCC_STS.

In a non-limiting embodiment, a first energy storage element 40 is a short term storage element and a second energy storage element 40 is a long term energy storage element. In a non-limiting example, the short term energy storage element is a capacitor referenced C5 in FIG. 1, and the long term energy storage element is a rechargeable battery referenced Bat in FIG. 1. In a non-limiting example, battery Bat is a lithium-ion battery.

Capacitor C5 and battery Bat are used as non-limiting examples in the following description.

In a non-limiting embodiment, said energy management circuit 30 is configured to alternately control the charging of capacitor C5 and of battery Bat in order to power, for example, motor 50 of said watch 1. To this end, it also includes a plurality of switches (not illustrated).

Thus, via its input VDD-SOL, energy management circuit 30 starts by charging capacitor C5, which is charged in a few seconds (typically between 3 to 5 seconds depending on the desired end experience). Then, when capacitor C5 is charged (it has reached a sufficient voltage, between 1.5V and 3 V, for example), energy management circuit 30 disconnects capacitor C5 from its input VDD_SOL and, via its input VDD-SOL, charges battery Bat, which charges more slowly over a few hours or even a few days, until it reaches a sufficient voltage, between 1.5 V and 3 V, for example.

While battery Bat is charging, capacitor C5 is discharging at output VSUP, which makes it possible to power motor 50 of watch 1 and thus to start the movement of watch 1. Capacitor C5 actually discharges in a few seconds.

Battery Bat takes over from capacitor C5 to power motor 50. Battery Bat also discharges across output VSUP, which makes it possible to power motor 50 of watch 1 for several months. Battery Bat can in fact take several months to discharge.

When capacitor C5 and battery Bat have each reached a sufficient voltage, energy management circuit 30 connects the two in parallel.

Thus, when thermoelectric generator 10 is active, the electrical energy generated by thermoelectric generator 10 arrives at input VDD_SOL, which makes it possible to charge capacitor C5 and battery Bat.

When thermoelectric generator 10 is inactive, i.e. it is no longer generating electrical energy, capacitor C5 and battery Bat are disconnected from input VDD_SOL.

Thermoelectric generator 10 becomes inactive when, for example, watch 1 is in thermal equilibrium and is no longer worn on the wrist. When it is placed on the wrist again, the alternating management of the charging of capacitor C1 and battery Bat described above starts again.

Output HR_LOW of energy management circuit 30 is configured to:
- change from a first logic state S1 to a second logic state S2 when thermoelectric generator 10 starts generating electrical energy, and
- change from second logic state S2 to first logic state S1 when said thermoelectric generator 10 finishes generating electrical energy.

Output HR_LOW thus indicates activity of thermoelectric generator 10.

Hereinafter, it is assumed that first logic state S1 is a high state and second state S2 is a low state. However, the reverse is also possible.

In a non-limiting embodiment, high state S1 is at potential +Vbat and low state S2 is at potential −Vbat.

Thus, output HR_LOW is in rising transition when it changes from low state S2 to high state S1 and falling transition when it changes from high state S1 to low state S2.

More particularly, output HR_LOW is configured to:
- change from high state S1 to low state S2 when said thermoelectric generator 10 starts generating electrical energy;
- change from low state S2 to high state S1 when said thermoelectric generator 10 finishes generating electrical energy.

The low state of output HR_LOW means that thermoelectric generator 10 is active. The high state of output HR_LOW means that thermoelectric generator 10 is inactive.

It is considered that, during normal use, output HR_LOW cannot have more than a hundred rising and/or falling transitions per day. A hundred transitions per day corresponds to a mean current of less than 0.1 microamps through the capacitor C1 mentioned below, which represents a low power consumption percentage of watch 1, less than 10%.

Energy management circuit 30 is connected to said at least one capacitor C1 described below.

Capacitor C1

Figure 2A:
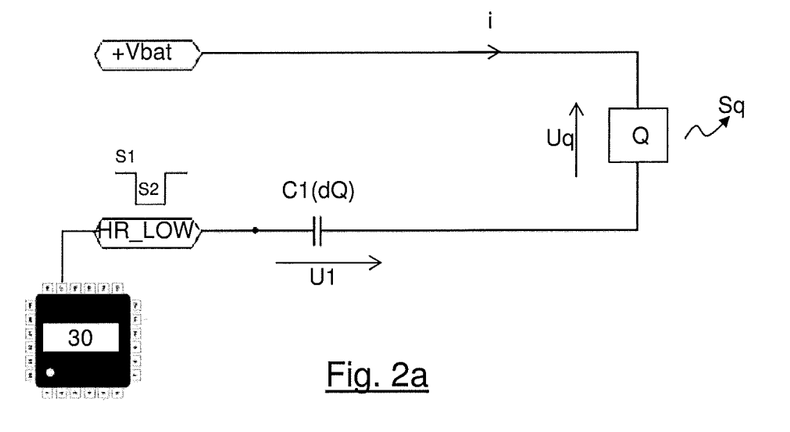
FIG. 2a represents the energy management circuit of FIG. 1 connected to a single capacitor, itself coupled to a load, according to the first embodiment.
Figure 2B:
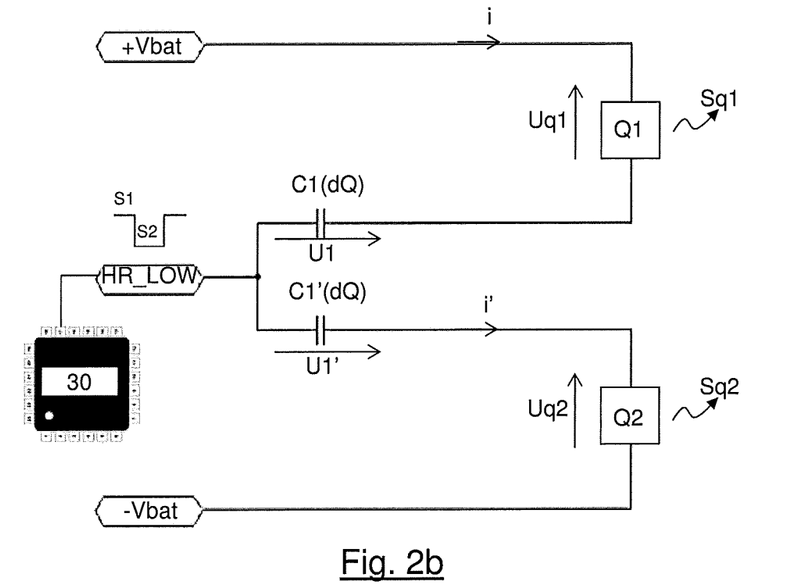
FIG. 2b represents the energy management circuit of FIG. 1 connected to two capacitors, each coupled to a load, according to a second non-limiting embodiment of the invention.

As illustrated in FIGS. 1, 2a and 2b, said at least one capacitor C1 is coupled to a load Q and is configured to:
- undergo a variation of load dQ when said output HR_LOW of said energy management circuit 30 changes from a state S1, S2 to another state S2, S1.
- supply current to said load Q when it undergoes said variation of load dQ.

The current that powers load Q is equal to dQ/dt. As the charge of a capacitor is expressed as Q=C*U, the maximum, in the non-limiting example provided, is Q1=C1*Vbat, and dQ=+ or −Q1

Capacitor 1 is connected in series with said load Q.

Thus, capacitor C1 is connected at one of its terminals to energy management circuit 30 and at the other of its terminals to load Q.

When capacitor C1 undergoes a variation of load dQ, the charging or discharging current i, otherwise referred to as current i, required for the charging or discharging thereof, temporarily flows into load Q allowing it to emit a signal Sq detectable by a measuring apparatus AT.

It will be noted that after a rising or falling transition of output HR_LOW, when said output HR_LOW remains in one of the two states S1, S2, there is no current i flowing in load Q. Thus, load Q does not use energy in steady state but only during rising and falling transitions. Its mean potential is Uq=0.

Current i which flows through load Q is actually a current burst since it is only produced when capacitor C1 undergoes a variation of load dQ, i.e. during rising and falling transitions of output HR_LOW. The intensity of this current burst is on the order of a milliamp. In a non-limiting example, it is comprised between 1 and 10 mA. It will be noted that the intensity of current bursts typically falls to 10% after a duration of less than 50 milliseconds. Thus, signal Sq emitted by load Q does not last long, with a duration typically of less than 50 milliseconds.

First Embodiment

In a first non-limiting embodiment illustrated in FIG. 2a, said energy management circuit 30 is connected to a single transmission circuit, formed by a capacitor C1 and a load Q.

Said capacitor C1 is coupled to load Q, which is itself connected to +Vbat in this example, and is configured to:
- charge when said output HR_LOW of said energy management circuit 30 changes from high state S1 to low state S2, namely when said output HR_LOW is in a falling transition; and/or
- to discharge when said output HR_LOW of said energy management circuit 30 changes from low state S2 to high state S1, namely when said output HR_LOW is in a rising transition.

Falling Transition

The charge of capacitor C1 in the falling transition of output HR_LOW corresponds to the start of electrical energy generation by thermoelectric generator 10. The current i required to charge capacitor C1 passes through load Q which then emits a signal Sq.

The change of state of output HR_LOW thus causes the emission of a signal Sq by load Q.

Thus, when thermoelectric generator 10 starts generating energy (it becomes active), load Q emits a signal Sq which is detectable by a measuring apparatus AT. The user therefore sees, via measuring apparatus AT, that thermoelectric generator 10 has just started, namely it has just begun generating electrical energy. It will be noted that, in a non-limiting example, the user is an operator who tests watch 1 in production or in after-sales service.

In a variant of the aforecited non-limiting example, thermoelectric generator 10 becomes active when watch 1 is placed on the user's wrist. Indeed, watch 1 comes into contact with human body heat.

After the falling transition, when output HR_LOW remains in low state S2 (thermoelectric generator 10 is still active), the value of current i flowing in load Q quickly drops to zero. Consequently, measuring apparatus AT no longer detects signal Sq.

It will be noted that, in the aforecited example, the emitted signal Sq is detectable by measuring apparatus AT a few seconds after thermoelectric watch 1 has been placed on the wrist or on a suitable support, once short term energy storage element C5 is charged with the electrical energy produced by thermoelectric generator 10.

Rising Transition

In the aforecited example and its variant, the discharging of capacitor C1 during the rising transition of output HR_LOW corresponds to an interruption to generation of electrical energy by thermoelectric generator 10. The current i required to discharge capacitor C1 passes through load Q which then either emits or does not emit signal Sq, depending on whether it is or is not configured to emit a signal in both current polarities.

In the case where load Q allows a signal Sq to be generated in both current polarities, a rising transition of output HR_LOW also causes the emission of a signal Sq. Thus, when thermoelectric generator 10 finishes generating energy (it becomes inactive), load Q can also emit a signal Sq which is detectable by a measuring apparatus AT. The user thus sees, via measuring apparatus AT, that thermoelectric generator 10 has just stopped operating, namely it has finished generating electrical energy. It will be noted that, in a non-limiting example, the user is an operator who tests watch 1 in production or in after-sales service.

In a non-limiting example, thermoelectric generator 10 becomes inactive when watch 1 is no longer worn on the user's wrist. Indeed, watch 1 is no longer in contact with human body heat and thus tends towards thermal equilibrium at the thermoelectric generator terminals.

In another non-limiting example, thermoelectric generator 10 becomes inactive when watch 1 is in full sun with a dark dial that absorbs energy from the sun. Even if it remains on the wrist, the case middle of watch 1 becomes warmer than the wrist. Thermoelectric generator 10 can stop several times during the day.

It is considered that, during normal use, thermoelectric generator 10 can stop and become active again at most one hundred times per day.

After the rising transition, when output HR_LOW remains in high state S1 (thermoelectric generator 10 is still inactive), the value of current i flowing in load Q quickly drops to zero. Consequently, measuring apparatus AT no longer detects signal Sq.

It will be noted that the emitted signal Sq, detectable by measuring apparatus AT, appears after several seconds to several minutes, depending on thermal conditions, once watch 1 has been removed from the wrist, a duration which corresponds to the time taken by the back cover of watch 1, which was heated by human body heat, to cool down.

It will be noted that FIG. 2a illustrates load Q connected to the positive terminal +Vbat of battery Bat. However, in another non-limited embodiment that is not illustrated, load Q could be connected to the negative terminal −Vbat of battery Bat or any other static potential.

Thus, the negative or positive electric pulse observed across potential Uq of load Q reflects the falling or rising transitions of output HR_LOW of energy management circuit 30. Load Q emits signal Sq as a function of this positive or negative electric pulse, according to whether the load was designed for unipolar or bipolar operation. Thus, measuring apparatus AT can detect the rising and falling transitions of said output HR_LOW through the emitted signal Sq and consequently can detect to start or end of electrical energy generation by thermoelectric generator 10.

Second Embodiment

In a second non-limiting embodiment illustrated in FIG. 2b, said energy management circuit 30 is connected to two distinct transmission circuits, each formed by a capacitor C1, C1' and a load Q1, Q2.

One of the capacitors is configured to undergo a variation of charge dQ when said output HR_LOW changes from high state S1 to low state S2 and the other capacitor is configured to undergo a variation of charge dQ when said output HR_LOW changes from low state S2 to high state S1.

Thus, in a non-limiting variant, capacitor C1 is configured to:
  charge when said output HR_LOW changes from high state S1 to low state S2, and
  supply current to load Q1 to which it is coupled when it charges, said load Q1 being configured to emit a signal Sq detectable by a measuring apparatus AT when charging current i of said capacitor C1 passes therethrough.

Further, capacitor C1' is configured to:
  discharge when said output HR_LOW changes from low state S2 to high state S1, and
  supply current to load Q2 to which it is coupled when it charges, said load Q2 being configured to emit a signal Sq' detectable by a measuring apparatus AT when charging current i' of said capacitor C1' passes therethrough.

Thus, the charging current i required to charge capacitor C1 flows in load Q1, and the discharging current i' required to discharge capacitor C1' flows in load Q2.

Thus, load Q1 emits a signal Sq1 when thermoelectric generator 10 starts generating electrical energy and load Q2 emits a signal Sq2 when thermoelectric generator 10 finishes generating electrical energy.

In a non-limiting embodiment, load Q1 is connected to the positive battery terminal +Vbat and load Q2 is connected to the negative battery terminal −Vbat. It is noted that loads Q1 and Q2 can also be connected to any other static potential.

Thus, the user of watch 1 can detect with a measuring apparatus AT, via the emitted signals Sq1, Sq2, the beginning and end of electrical energy generation by thermoelectric generator 10.

It will be noted that a signal Sq1 is detectable by a measuring apparatus AT a few seconds after thermoelectric watch 1 has been placed on the wrist or on a suitable support, once energy storage device C5 is charged with the electrical energy produced by thermoelectric generator 10.

It will be noted that the emitted signal Sq2, detectable by measuring apparatus AT, appears after several seconds to several minutes, depending on thermal conditions, once watch 1 has been removed from the wrist, a duration which corresponds to the time taken by the back cover of watch 1, which was heated by human body heat, to cool down.

Load Q

As previously described, load Q is configured to emit a detectable signal Sq when the charging or discharging current i of said capacitor C1 passes therethrough.

Depending on the type of load described below, it will be sensitive to a rising transition, a falling transition, or both, namely it will only emit a signal Sq during a rising transition, during a falling transition, or during a rising transition and a falling transition.

In non-limiting embodiments, load Q is:
  1) a light emitting diode emitting in the infrared spectrum (illustrated in FIGS. 3a and 3c),
  2) an oscillating coil/capacitor circuit LC (illustrated in FIGS. 4a and 4), or resistor/capacitor circuit RC,
  3) an electromechanical transducer TE (illustrated in FIGS. 5a and 5c),
  4) a coil L (illustrated in FIG. 6a). Alternatively, the coil can be replaced by a capacitor for capacitive detection.

The various embodiments of load Q are presented below.

1) Light Emitting Diode LED Emitting in the Infrared Spectrum

Figure 3A:
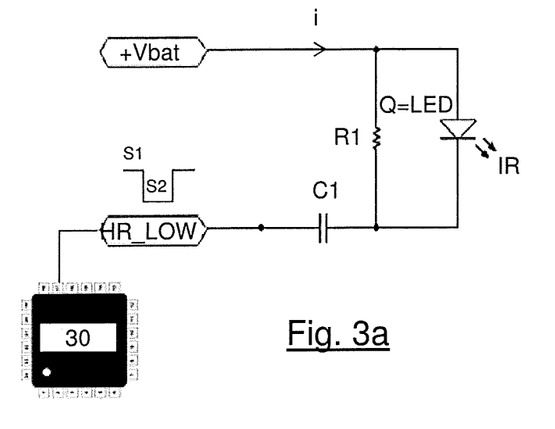
FIG. 3a represents the energy management circuit and the capacitor of FIG. 2a, said capacitor being coupled to a load which is a light emitting diode emitting in the infrared spectrum, according to a first non-limiting variant of the first embodiment.

Light emitting diode LED is configured to emit an infrared signal IR when charging or discharging current i from said capacitor C1 passes therethrough.

In this manner, the user, by means of measuring apparatus AT, can detect the emitted infrared signal and consequently detect the start or end of electrical energy generation by thermoelectric generator 10.

In a first non-limiting embodiment illustrated in FIG. 3a, energy management circuit 30 is connected to a single capacitor C1, which is itself coupled to a light emitting diode LED. Watch 1 thus has only one light emitting diode LED. The non-limiting example of FIG. 3a illustrates a light emitting diode LED which is a load Q arranged according to FIG. 2a. Light emitting diode LED functions as result of a rising transition or falling transition of output HR_LOW. Either the start or the end of electrical energy generation by thermoelectric generator 10 is detected by means of the light emitting diode, In a non-limiting embodiment, said at least one capacitor C1 is connected in series to a resistor R1. Resistor R1 is connected in parallel with said at least one light emitting diode LED.

Resistor R1 allows said capacitor C1 to discharge slowly and gradually after each rising or falling transition of output HR_LOW, i.e. when the light emitting diode is no longer conducting. It will be noted that, in a non-limiting example, resistor R1 causes capacitor C1 to discharge 90 to 99% in 5 and 10 seconds between each transition. The time constants RC are thus typically between 5 and 10 seconds. Capacitor C1 discharges in order to obtain zero potential difference at its terminals.

Figure 3B:
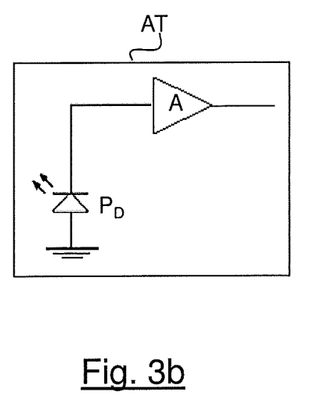
FIG. 3b represents a measuring apparatus configured to measure an infrared signal emitted by said light emitting diode of FIG. 3a, using a photodetector.

In a non-limiting embodiment illustrated in FIG. 3b, the measuring apparatus AT configured to detect infrared signal IR includes a photodiode $P_D$ and an amplifier A. Thus, when measuring apparatus AT is in proximity to watch 1, it detects infrared signal IR through an optical coupling which is created between photodiode $P_D$ and infrared diode IR of watch 1. Measuring apparatus AT is, for example, a photodetector.

Figure 3C:
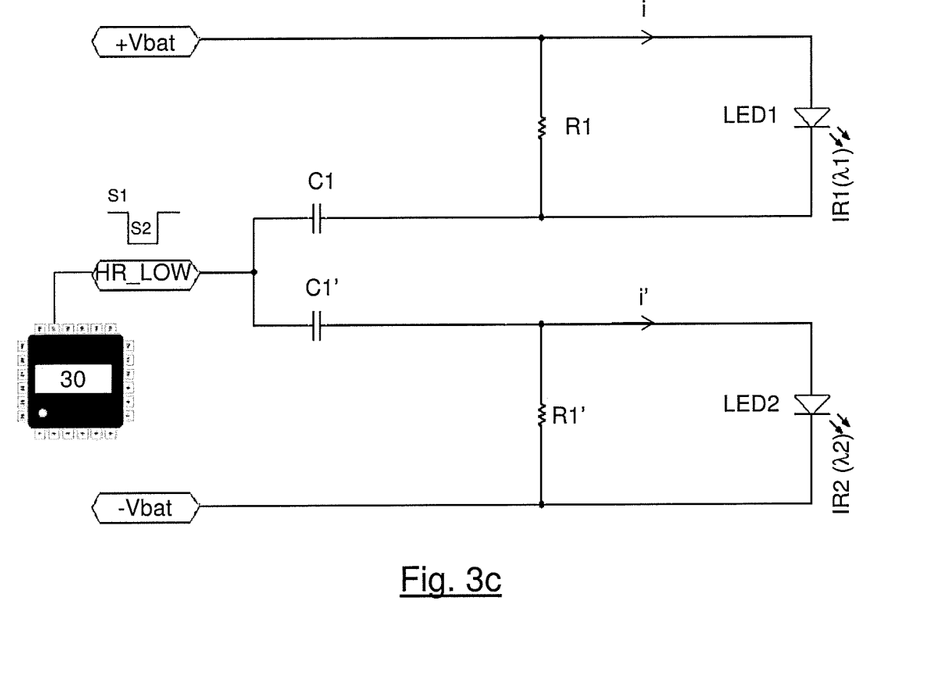
FIG. 3c represents the energy management circuit and the two capacitors of FIG. 2b, said capacitors each being coupled to a load which is a light emitting diode emitting in the infrared spectrum, according to a first non-limiting variant of the second embodiment.

In a second non-limiting embodiment illustrated in FIG. 3c, energy management circuit 30 is connected to two capacitors C1, C1', each respectively coupled to a light emitting diode LED1, LED2.

Watch 1 thus includes two light emitting diodes LED1, LED2. The non-limiting example of FIG. 3c illustrates two infrared diodes LED1, LED2 which are respectively loads Q1, Q2 arranged according to FIG. 2b and operating as described with reference to FIG. 2b. The start and also the end of electrical energy generation by thermoelectric generator 10 is detected by means of the two infrared diodes LED1, LED2.

Light emitting diodes LED1, LED2 are configured to emit infrared signals IR1, IR2 on different wavelengths $\lambda 1$, $\lambda 2$.

In a non-limiting embodiment, said capacitor C1 is connected to a resistor R1 and said capacitor C1' is connected to a resistor R1'. Resistor R1 is connected in parallel to said at least one light emitting diode LED1 and resistor R1' is connected in parallel to said at least one infrared diode LED1'

Resistor R1 allows said capacitor C1 to discharge slowly and gradually after each falling transition of output HR_LOW, i.e. when light emitting diode LED1 is no longer conducting.

Resistor R1' allows said capacitor C1' to discharge slowly and gradually after each rising transition of output HR_LOW, i.e. when light emitting diode LED2 is no longer conducting.

In a non-limiting embodiment that is not illustrated, measuring apparatus AT is configured to detect infrared signal IR1 and infrared signal IR2 by means of two photodiodes $P_D$ and two amplifiers A, the two photodiodes $P_D$ being provided with optical filters which make them sensitive to two respective wavelengths $\lambda 1$, $\lambda 2$ in order to detect the respective infrared signals IR1 and IR2. It is technically possible to adopt a similar approach by replacing the infrared LEDs with ultraviolet LEDs and having a measuring device that is sensitive to UV wavelengths, provided that the power emitted is safe.

2) Oscillating Circuit LC

Figure 4A:
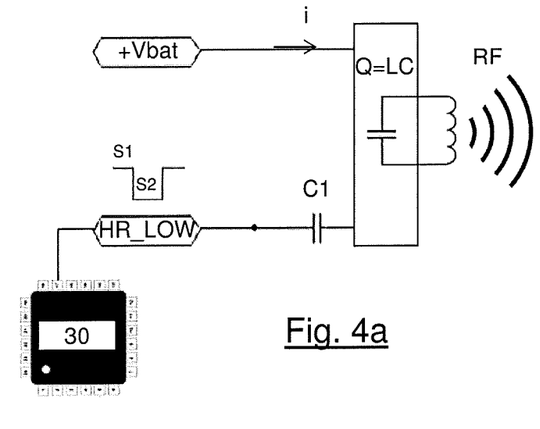
FIG. 4a represents the energy management circuit and the capacitor of FIG. 2a, said capacitor being coupled to a load which is an oscillating circuit, according to a second non-limiting variant of the first embodiment.

Oscillating circuit LC is configured to emit a radiofrequency signal RF when charging or discharging current i from said capacitor C1 passes therethrough.

In this manner, the user, by means of measuring apparatus AT, can detect the emitted radiofrequency signal RF and consequently detect the start or end of electrical energy generation by thermoelectric generator 10.

In a first non-limiting embodiment illustrated in FIG. 4a, energy management circuit 30 is connected to a single capacitor C1, which is itself coupled to an oscillating circuit LC. Watch 1 thus has only one oscillating circuit LC. The non-limiting example of FIG. 4a illustrates an oscillating circuit LC which is a load Q arranged according to FIG. 2a. Oscillating circuit LC generates a radiofrequency signal RF of a certain frequency f when it is excited by a positive or negative electric pulse. It therefore functions as result of a rising transition or falling transition of output HR_LOW. Either the start or the end of electrical energy generation by thermoelectric generator 10 is detected by means of oscillating circuit LC.

Figure 4B:
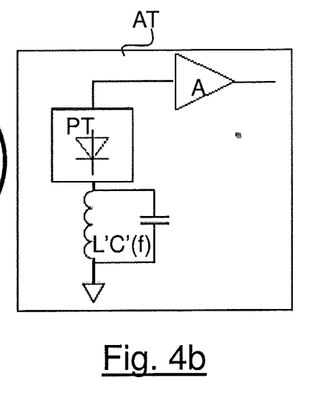
FIG. 4b represents a measuring apparatus configured to measure a radio frequency signal emitted by said oscillating circuit of FIG. 4a, FIG. 4c represents the energy management circuit and the two capacitors of FIG. 2b, said capacitors each being coupled to a load which is an oscillating circuit, according to a second non-limiting variant of the second embodiment.
Figure 4C:
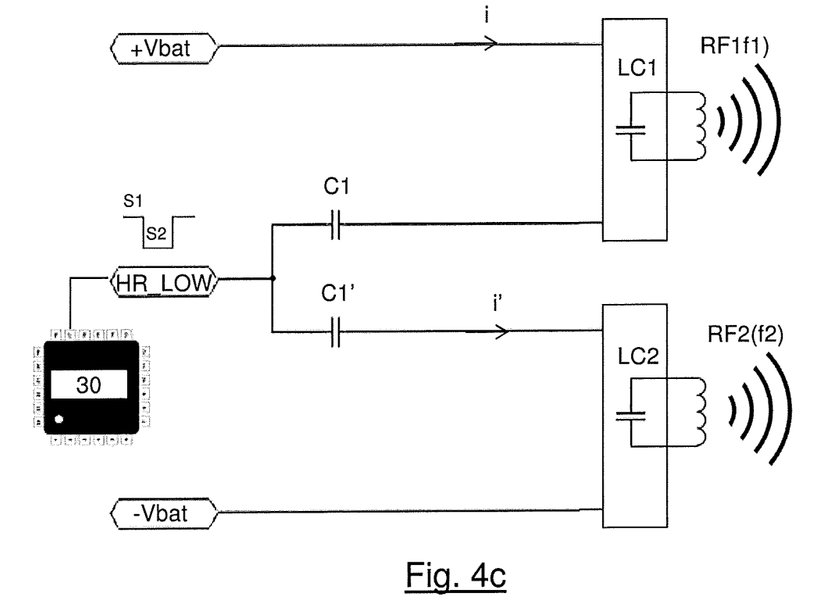

In a non-limiting embodiment illustrated in FIG. 4b, the measuring apparatus AT configured to detect radiofrequency signal RF includes an oscillating circuit L'C' tuned to frequency f, a bridge rectifier PT and an amplifier A. Thus, when measuring apparatus AT is in proximity to watch 1, it detects radiofrequency signal RF through an inductive coupling between its oscillating circuit L'C' and oscillating circuit LC of watch 1. Oscillating circuit L'C' is tuned to the same frequency as oscillating circuit LC. Bridge rectifier PT generates a continuous voltage representative of the radiofrequency signal RF envelope, which is a damped oscillation at high frequency. In a non-limiting embodiment, radiofrequency signal RF lies within a frequency range of 100 Hz to 100 kHz.

In a second non-limiting embodiment illustrated in FIG. 5c, energy management circuit 30 is connected to two capacitors C1, C1', each respectively coupled to an oscillating circuit LC1, LC2.

Watch 1 thus includes two oscillating circuits LC1, LC2. The non-limiting example of FIG. 5c illustrates two oscillating circuits LC1, LC2 which are respectively loads Q1, Q2 arranged according to FIG. 2b and operating as described with reference to FIG. 2b. The start and also the end of electrical energy generation by thermoelectric generator 10 is detected by means of the two oscillating circuits LC1, LC2.

Oscillating circuits LC1, LC2 are configured to emit radiofrequency signals RF1, RF2 at different frequencies f1, f2.

In a non-limiting embodiment that is not illustrated, measuring apparatus AT configured to detect radiofrequency signal RF1 and radiofrequency signal RF2 includes two oscillating circuits L'C', two bridge rectifiers PT and two amplifiers A, the two oscillating circuits L'C' being tuned to the two respective frequencies f1, f2 in order to detect the respective radiofrequency signals RF1 and RF2. A variant of this embodiment implements an RC oscillator in place of an LC oscillator.

3) Electromechanical Transducer TE

Electromechanical transducer TE is configured to emit an acoustic signal AC when charging or discharging current i from said capacitor C1 passes therethrough.

In this manner, the user, by means of measuring apparatus AT, can detect the emitted acoustic signal AC and consequently detect the start or end of electrical energy generation by thermoelectric generator 10.

In a first non-limiting embodiment illustrated in FIG. 5a, energy management circuit 30 is connected to a single capacitor C1, which is itself coupled to an electromechanical transducer TE. Watch 1 thus has only one electromechanical transducer TE. The non-limiting example of FIG. 5a illustrates an electromechanical transducer TE which is a load Q arranged according to FIG. 2a. Electromechanical transducer TE functions as result of a rising transition or falling transition of output HR_LOW. Either the start or the end of electrical energy generation by thermoelectric generator 10 is detected by means of electromechanical transducer TE.

In a non-limited embodiment illustrated in FIG. 4a, electromechanical transducer TE includes a coil L which cooperates with a flexible ferromagnetic strip FM excited by coil L. When current i passes through coil L, the latter emits an electromagnetic field. Flexible ferromagnetic strip FM vibrates under the effect of the electromagnetic field and transmits it vibration to back cover F of watch 1. This generates an acoustic signal AC. Flexible ferromagnetic strip FM can vibrate at the resonance frequency r, In a non-limiting embodiment, acoustic signal AC lies within a frequency range of 100 Hz to 100 kHz.

In a non-limiting embodiment illustrated in FIG. 5b, the measuring apparatus AT configured to detect acoustic signal AC includes a microphone MI and an amplifier A. Thus, when measuring apparatus AT is in proximity to watch 1, it detects acoustic signal AC through an acoustic coupling between microphone MI and back cover F of watch 1, with microphone MI detecting the vibration of flexible ferromagnetic strip FM which is transmitted to back cover F of watch 1.

In a second non-limiting embodiment illustrated in FIG. 5c, energy management circuit 30 is connected to two capacitors C1, C1′, each respectively coupled to an electromechanical transducer TE1, TE2.

Watch 1 thus includes two electromechanical transducers TE1, TE2. The non-limiting example of FIG. 5c illustrates two electromechanical transducers TE1, TE2 which are respectively loads Q1, Q2 arranged according to FIG. 2b and operating as described with reference to FIG. 2b. The start and also the end of electrical energy generation by thermoelectric generator 10 is detected by means of the two electromechanical transducers TE1, TE2.

Electromechanical transducers TE1, TE2 are configured to emit acoustic signals AC1, AC2 at different resonance frequencies r1, r2. To this end, they each include a different sized flexible ferromagnetic strip FM1, FM2 which can vibrate at a resonance frequency r1, r2.

In a non-limiting embodiment that is not illustrated, measuring apparatus AT configured to detect acoustic signal AC1 and acoustic signal AC2 includes two microphones MI and two amplifiers A, microphones MI being tuned to the two respective resonance frequencies r1, r2 in order to detect the respective acoustic signals AC1 and AC2. A variant of this embodiment implements the electromechanical transducer strip described to strike a counter piece as a result of action of the coil, and it is this impact that is measured by the measuring apparatus, in addition to the vibration of the strip.

4) Coil L

Coil L is configured to emit a magnetic field EM when charging or discharging current i from said capacitor C1 passes therethrough.

In this manner, the user, by means of measuring apparatus AT, can detect the emitted magnetic field EM and consequently detect the start or end of electrical energy generation by thermoelectric generator 10.

The non-limiting example of FIG. 6a illustrates a coil L which is a load Q arranged according to FIG. 2a and operating as described with reference to FIG. 2a. Coil L functions as result of a rising transition or falling transition of output HR_LOW. Thus, either the start or the end of electrical energy generation by thermoelectric generator 10 is detected by means of the coil.

In a non-limiting embodiment illustrated in FIG. 6b, measuring apparatus AT is configured to detect magnetic field EM by means of a coil L′. Thus, when measuring apparatus AT is in proximity to watch 1, it detects electromagnetic signal EM through a magnetic coupling between its coil L′ and coil L of watch 1. As the induced voltage polarity is sensitive to the derivative of the emitted magnetic field, it is possible to detect the start and the end of electrical energy generation by thermoelectric generator 10, with a single transmission and detection channel, i.e with a single same coil L. Alternatively, the current and coil L can be replaced by a voltage and a capacitor, and the electric charge of the capacitor can be detected with a suitable measuring apparatus.

It will be noted that the amplifier A contained in the various measuring apparatuses AT described in the case of load Q 1) to 4) can amplify the various detected signals Sq.

Thus, the measuring apparatuses AT adapted to the various loads can detect the activity of thermoelectric generator 10. Watch 1 can therefore be tested in production, once the watch has been assembled. Watch 1 can also be tested in after-sales service. The various loads Q and the associated measuring apparatuses AT described have a limited cost.

Consequently, detection is simple to carry out and is of limited cost.

Third Non-Limiting Embodiment

As illustrated in FIG. 7, thermoelectric watch 1 includes:
a thermoelectric generator 10,
a voltage booster 20,
an energy management circuit 30,
at least one capacitor C1.
Thermoelectric watch 1 also includes:
an energy storage element 40,
a motor 50 configured to move the hands and dial(s) (not illustrated) of thermoelectric watch 1,
a resonator 60 configured to act as frequency base for thermoelectric watch 1.

The description of these elements with reference to the first and second embodiments is applicable in this third non-limiting embodiment.

As illustrated in FIG. 1, thermoelectric watch 1 also includes a conductive element F.

Capacitor C1 and conductive element F are described below.

Capacitor C1

As illustrated in FIG. 7, capacitor C1 is electrically connected to conductive element F, which is itself connected to input impedance Z of measuring apparatus AT.

Thus, capacitor C1 is connected by one of its terminals to energy management circuit 30 and by the other of its terminals to conductive element F.

In a non-limiting embodiment, capacitor C1 is configured to charge when said output HR_LOW of said energy management circuit 30 changes from high state S1 to low state S2 and vice versa.

In a non-limiting variant, capacitor C1 is configured to:
- charge when said output HR_LOW of said energy management circuit 30 changes from high state S1 to low state S2, namely when said output HR_LOW is in a falling transition. This corresponds to the start of electrical energy generation by thermoelectric generator 10 (the latter becomes active),
- also charge when said output HR_LOW of said energy management circuit 30 changes from low state S2 to high state S1, namely when said output HR_LOW is in a rising transition. This corresponds to the start of electrical energy generation by thermoelectric generator 10 (the latter becomes active).

In one example, thermoelectric generator 10 becomes active when watch 1 is placed on the user's wrist and becomes inactive when watch 1 is no longer worn on the user's wrist.

In another example, thermoelectric generator 10 becomes inactive when watch 1 is in full sun with a dark dial that absorbs energy from the sun. Even if it remains on the wrist, the case middle of watch 1 becomes warmer than the wrist. Thermoelectric generator 10 can stop several times during the day. It is considered that it can stop and become active again at most one hundred times per day.

Conductive Element F

In a non-limiting embodiment, conductive element F is the back cover of watch 1. Back cover F of watch 1 is easily accessible and a measuring apparatus AT can thus easily cooperate with back cover F of watch 1.

In a non-limiting embodiment, conductive element F is made of oxidized aluminium.

In a non-limiting embodiment, conductive element F is thermally insulated. This allows a heat flow from the wrist to be mostly channelled towards thermoelectric generator 10 to allow satisfactory generation of electrical energy by watch 1. Thermal insulation is achieved by means of a thermal insulator I In the case of back cover F of watch 1, in a non-limiting embodiment thermal insulator I is a plastic ring which encircles said back cover F.

In a non-limiting embodiment, conductive element F is also electrically insulated from case middle K of watch 1 by means of thermal insulator I. This avoids a short-circuit with case middle K of watch 1. Thus, conductive element F is electrically floating in order to serve as contact electrode for measuring apparatus AT. Thus, back cover F of watch 1 is used as a measuring terminal.

This contact electrode allows the electric charges to be transferred from conductive element F to apparatus AT.

As illustrated in FIG. 8, conductive element F is in contact with measuring apparatus AT. Measuring apparatus AT has an input impedance Z, an amplifier A, a measuring point P1 and an earth point M1. Impedance Z has a high value which makes it possible to measure a voltage pulse corresponding to the transfer of a small quantity of electric charges.

Back cover F of watch 1 can thus transfer electric charges by capacitive coupling with measuring apparatus AT. The electric charges will in fact move inside back cover F of watch 1, with back cover F acting in this case like a capacitor. Thus, during a falling transition corresponding to the start of electric energy generation by thermoelectric generator 10, and during a rising transition corresponding to the end of electric energy generation by thermoelectric generator 10, electric charges are transferred from capacitor C1 to back cover F and then from back cover F to measuring apparatus AT.

Measuring point P1 is in contact with back cover F of watch 1 and makes possible the transfer of electric charges. Earthing point M1 makes it possible to earth case middle K of watch 1. Charging current i from capacitor C1 can thus flow in a closed circuit that includes back cover F, impedance Z and case middle K.

Thus, the measuring apparatus AT coupled to back cover F can detect the activity of thermoelectric generator 10. Watch 1 can therefore be tested in production, once the watch has been assembled. Watch 1 can also be tested in after-sales service. Capacitor C1 and the associated measuring apparatus AT described have a limited cost. Consequently, detection is simple to carry out and is of limited cost.

Of course, the present invention is not limited to the illustrated examples but is capable of different variants and modifications that will appear to those skilled in the art.

Thus, in another non-limiting embodiment, the various loads Q can generally be connected to any static potential other than +Vbat and −Vbat.

The invention claimed is:

1. A thermoelectric watch comprising:
   a thermoelectric generator,
   a voltage booster connected to said thermoelectric generator;
   an energy management circuit connected to said voltage booster and configured to control the charging of at least one energy storage element, said energy management circuit including an output configured to change from a first logic state to a second logic state when said thermoelectric generator starts generating electrical energy, and to change from the second logic state to the first logic state when said thermoelectric generator finishes generating electrical energy,
   wherein the watch further includes at least one capacitor connected to said energy management circuit, coupled to a load configured to:
     undergo a variation of load when said output of said energy management circuit changes from the first state to the second state and from the second state to the first state,
     supply current to said load when said capacitor undergoes said variation of load, said load being configured to emit a signal detectable by a measuring apparatus when said current flows therethrough, and
   wherein, when the energy management circuit is steady in the first state and when the energy management circuit is steady in the second state, no current is supplied to the load.

2. The thermoelectric watch according to claim 1, wherein said load is a light emitting diode configured to emit an infrared or ultraviolet signal.

3. The thermoelectric watch according to claim 2, wherein a resistor is connected in parallel to the light emitting diode.

4. The thermoelectric watch according to claim 1, wherein said load is an oscillating circuit configured to emit a radiofrequency signal.

5. The thermoelectric watch according to claim 1, wherein said load is an electromechanical transducer configured to emit an acoustic signal.

6. The thermoelectric watch according to claim 1, wherein said load is a coil configured to emit an electromagnetic field, or a capacitor configured to emit an electrostatic field.

7. The thermoelectric watch according to claim 1, wherein said thermoelectric watch includes two capacitors connected to said energy management circuit, each coupled to a load, one of the capacitors being configured to:
    undergo a variation of load when said output of said energy management circuit changes from the first logic state to the second logic state,
    supply current to the load to which said capacitor is coupled when it undergoes said variation of load, said load being configured to emit a signal detectable by a measuring apparatus when said current flows therethrough, the other capacitor being configured to:
    undergo a variation of load when said output of said energy management circuit changes from the second logic state to the first logic state,
    supply current to the load to which said capacitor is coupled when it undergoes said variation of load, said load being configured to emit a signal detectable by the measuring apparatus when said current flows therethrough.

8. The thermoelectric watch according to claim 7, wherein the loads are light emitting diodes configured to emit infrared signals on different wavelengths.

9. The thermoelectric watch according to claim 7, wherein the loads are oscillating circuits configured to emit radiofrequency signals of different frequencies.

10. The thermoelectric watch according to claim 7, wherein the loads are electromechanical transducers configured to emit electroacoustic signals of different resonance frequencies.

11. The thermoelectric watch according to claim 1, wherein the management circuit includes a push-pull amplifier stage.

12. The thermoelectric watch according to claim 1, wherein said energy management circuit is configured to alternately control the charging of two energy storage elements in order to power a motor of said thermoelectric watch.

* * * * *